United States Patent

[11] 3,604,609

[72] Inventor Edgar H. Walls
Allentown, Pa.

[21] Appl. No. 832,871
[22] Filed Dec. 2, 1968
Division of Ser. No. 621,701, Mar. 8, 1967, Patent No. 3,465,415
[45] Patented Sept. 14, 1971
[73] Assignee Western Electric Company, Incorporated
New York, N.Y.

[54] APPARATUS FOR ELIMINATING ICICLELIKE FORMATIONS ON WAVE-SOLDERED CONNECTIONS ON CIRCUIT SUBSTRATES
10 Claims, 6 Drawing Figs.

[52] U.S. Cl. .......... 228/19, 29/471.1, 228/37, 228/40
[51] Int. Cl. .......... B23k 1/00, B23k 5/00
[50] Field of Search .......... 29/471.1; 228/37, 38, 40, 19, 20

[56] References Cited

UNITED STATES PATENTS

| | | | |
|---|---|---|---|
| 2,553,547 | 5/1951 | Brown et al. | 228/22 |
| 2,866,430 | 12/1958 | Flynn | 228/22 |
| 2,910,030 | 10/1959 | Flynn | 228/22 |
| 2,993,272 | 7/1961 | Carlzen et al. | 228/37 X |
| 3,056,370 | 10/1962 | Barnes et al. | 228/37 |
| 3,084,650 | 4/1963 | Johns | 228/37 X |

*Primary Examiner*—John F. Campbell
*Assistant Examiner*—R. Craig
*Attorneys*—H. J. Winegar, R. P. Miller and J. L. Landis

ABSTRACT: Iciclelike formations of solder which occur when a circuit substrate and associated conductive leads pass over a wave-soldering machine are reduced in size by passing the substrate over a fine stretched wire so positioned that a small space exists between the surface of the wire and the highest projection on the circuit substrate, breaking the surface tension of the formations.

Inventor

E.H. WALLS

By

Attorney

APPARATUS FOR ELIMINATING ICICLELIKE FORMATIONS ON WAVE-SOLDERED CONNECTIONS ON CIRCUIT SUBSTRATES

This application is a division of application Ser. No. 621,701, filed Mar. 8, 1967, now Pat. No. 3,465,415.

BACKGROUND OF THE INVENTION

This invention relates to apparatus for joining conductive leads to a circuit affixed to a surface of a substrate, and more particularly to apparatus for minimizing iciclelike formations of solder connections when using wave-soldering equipment.

A substrate, having a circuit affixed to a surface thereof, can be of different types: printed circuit boards, and so-called thin films and thick films deposited on glass plates and ceramic substrates, for example. Such articles can be termed, generically, "circuit substrates."

It becomes necessary, at times, to couple conductive leads (such as clip leads, wires, and terminal leads of components, for example) to the circuit substrate. Conductive leads are often affixed to a circuit of a substrate by passing the substrate over wave-soldering apparatus so that the conductive leads are soldered to the circuit. This process is widely used in various branches of the electronics field.

A basic problem associated with wave-soldering of circuit substrates is icicling. In the past, it was required that whenever wave soldering was performed, a manual touchup operation was necessary to remove icicles, to remove excessive solder, to eliminate solder bridges, etc.

In certain applications, circuit substrates are mounted in a fixture, separated from each other by discrete distances. Excessive solder, or icicles, may hinder the mounting of such substrates. They may also cause malfunctioning of the electrical circuit due to short-circuiting, for example. A "solder bridge" is an undesirable connection of solder between circuit paths due to excessive solder, for example.

In certain types of production of wave-soldered circuit substrates, in the neighborhood of 3 percent of soldered substrates were unsatisfactory due to icicles or excessive solder.

Various suggestions for eliminating icicles on wave-soldered substrates have been made in the past with little success. For example, the use of various organic compounds placed on the surface of molten solder in the solder pot helps reduce solder height, but presents the additional and undesirable problems of smoke fumes, and pot and pump contamination when used in a wave-soldering machine.

Various experiments were performed for removing the icicles, while in their molten state, by directing a heat gun to the circuit board as they passed by the solder wave, but without success. Another attempt involved linear vibrations coupled to the circuit substrate to shake off excess solder and to possibly reduce the surface tension while the solder was still in the molten state. Vibrations created other problems due to cold solder joints and displacement of the clip leads with respect to the contact pads associated with thin-film circuitry.

Although the problem appears relatively simple, it is believed that the entire industry widely accepted the icicle problem as being a natural byproduct of the wave soldering operation. Hence, a practical solution to this problem is desirable.

SUMMARY OF THE INVENTION

It is an object of this invention to provide new and improved apparatus for reducing or eliminating iciclelike formations on wave-soldered connections on circuit substrates.

It is another object of this invention to provide new and improved apparatus for lowering the solder profile across a circuit substrate so as to enable greater quantities of circuit substrates to be housed within a given fixture.

The foregoing and other objects are accomplished in accordance with certain features of the invention by an apparatus which includes a wave-soldering device for applying a wave of molten solder to a surface of the substrate. Suitable means are provided for moving the circuit substrate past the soldering device and then past a taut fine wire while the formations of solder are still in the molten state. The wire is so positioned that a small space exists between the surface of the wire and the highest projection on the circuit board so that the formations of solder are limited in size.

By providing a small space between the surface of the wire and the highest projection on the circuit board, snagging of the wire with the component or wire leads is eliminated and cold solder connections are avoided.

BRIEF DESCRIPTION OF THE DRAWINGS

Other objects, advantages and features of the invention will be apparent from the following detailed description of a specific embodiment thereof, when taken in conjunction with the appended drawings, in which.

DESCRIPTION OF THE PREFERRED EMBODIMENT

Figure 1:
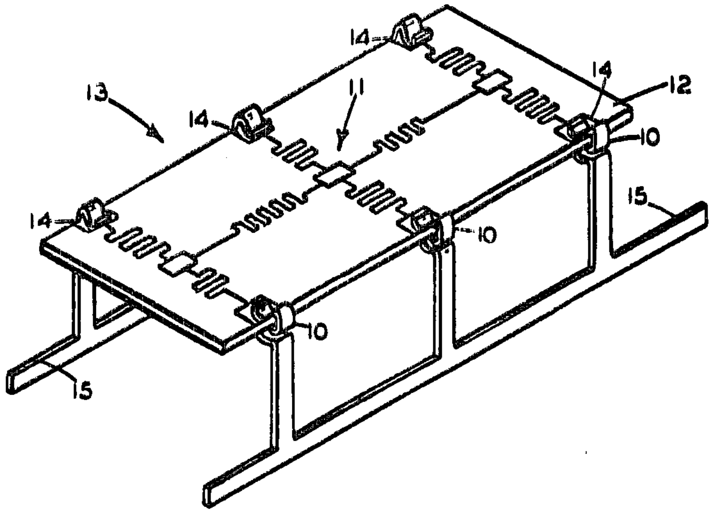
FIG. 1 is a perspective view of a circuit substrate, having an electrical circuit affixed to its top substrate, with conductive clip leads attached thereto.

Referring now in detail to the drawings, and particularly to FIG. 1, the illustrative embodiment of the invention concerns apparatus for joining conductive leads, such as clip leads 10—10 to a circuit 11 affixed to one surface 12 of a substrate 13. The circuit 11 includes various contact pads 14—14, in known manner, for physical attachment to the respective clip leads 10—10.

The leads 10—10 illustrated in FIG. 1 are coupled and joined together by common supporting members 15—15 on each side of the substrate 13. The members 15—15 are used as temporary supports during the wave-soldering operation. At a subsequent stage, the members 15—15 are severed so that the individual leads 10—10 become separated and can be coupled to suitable electrical equipment as desired.

A wave-soldering machine 17 (FIG. 2), well known in the art, produces a wave of molten solder, the crest 18 of which is caused by a suitable pump (not shown) within the wave-soldering machine 17. The molten solder is heated and recirculated within the solder machine 17 and pump along a frontal wave in well-known manner.

A taut fine wire 19, oriented parallel to the solder wave and in its immediate vicinity is positioned just below the crest 18 of the solder at one side thereof, and above a reflecting baffle 25. Due to the proximity of the wire 19 to the molten solder and the baffle 25, the wire 25 is warmed above room temperature by the heat from the molten solder, a substantial portion of which is reflected by the baffle 25 to the wire. The wire 19 is constructed of suitable material which does not wet with solder, such as stainless steel.

A carrier 20 (FIG. 3), which can be transported by a moving mechanism 22, supports the circuit substrate 13 by engaging with the support members 15—15 of the associated clip leads 10—10, in such a manner that the circuit 11 engages with the molten solder wave. The direction of movement of the carrier 20 and the substrate 13 is such that the wire 19 is on the emerging side of the solder wave. The wire 19 is positioned a small distance away from the greatest projection on the circuit substrate 13 (specifically, in this embodiment, the downwardmost projection of the clip leads 10—10, FIG. 4) so that the wire 19 does not snag with such projection or cause such leads 10—10 to disengage or move with respect to the substrate 13.

In operation, the circuit substrate 13 is transported by the moving mechanism 22, initially, through a solder-flux bath (not shown). The solder flux, in known manner, acts to clean the substrate 13 and to promote union of the circuit 11 with the leads 10—10 upon the subsequent solder-dip operation. The circuit substrate 13 is further pretreated, in known manner, by passage through a heating zone to prevent thermal shock upon its engagement with the solder wave.

Figure 2:
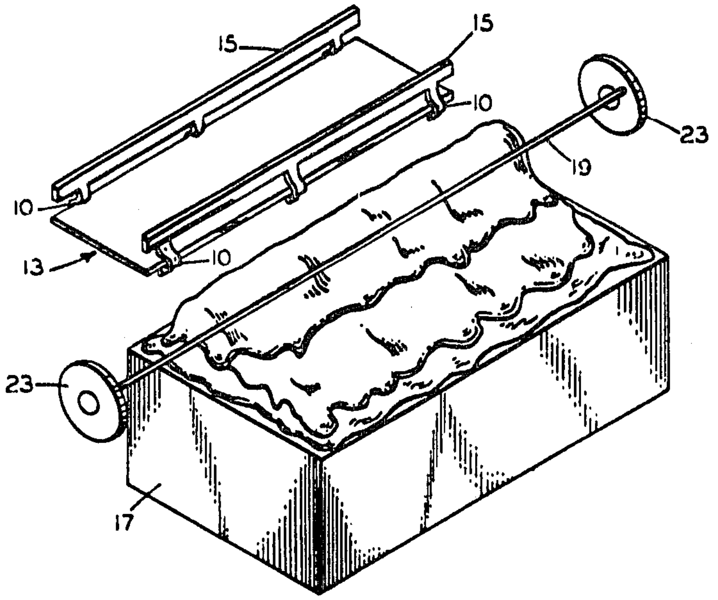
FIG. 2 is a perspective view, with the circuit substrate inverted, illustrating a preferred embodiment of the invention with the circuit substrate depicted prior to engagement with the wave-soldering apparatus.
Figure 3:
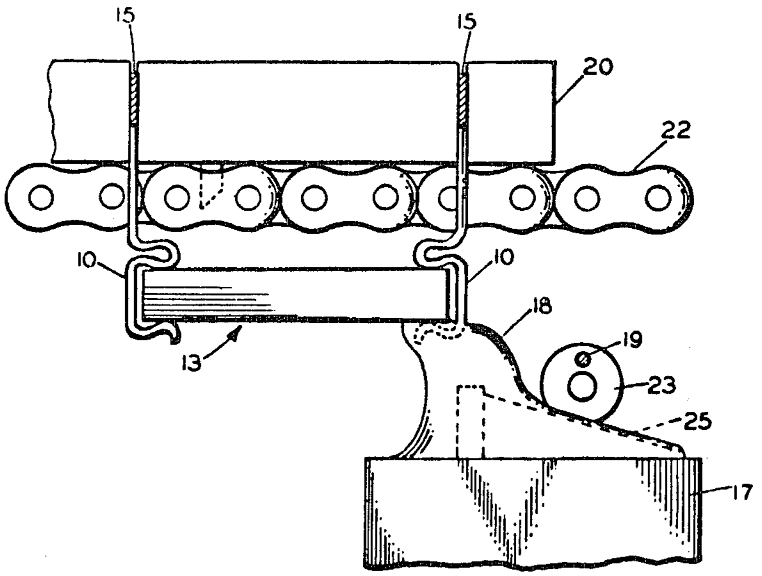
FIG. 3 is an elevational view of the preferred embodiment, showing the circuit substrate as it engages with the solder wave.
Figure 4:
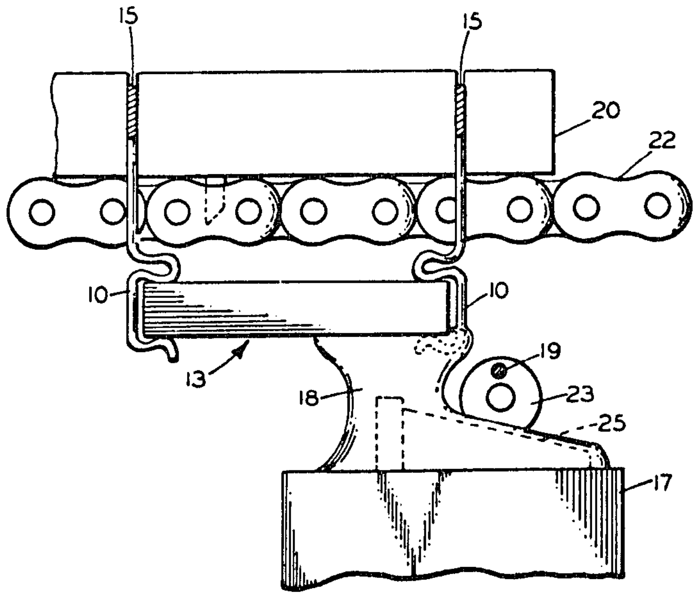
FIG. 4 is a view similar to FIG. 3, showing an intermediate position of the solder wave with the circuit substrate.
Figure 5:
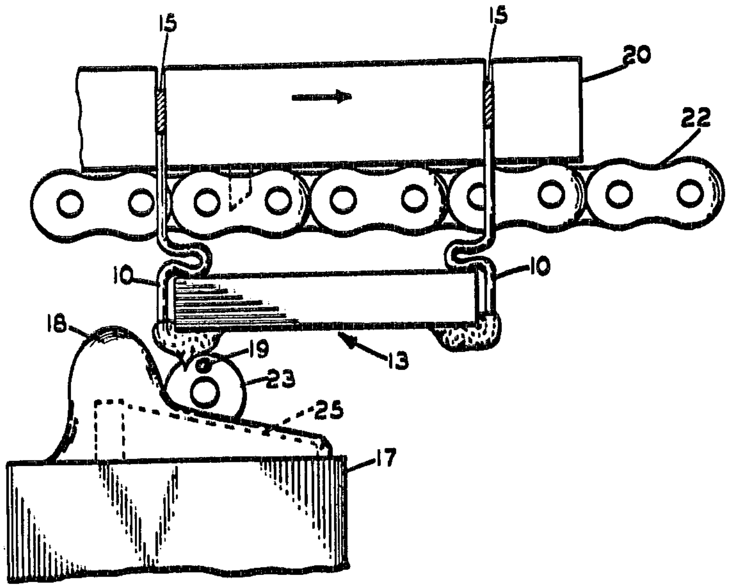
FIG. 5 is a view similar to FIG. 4 showing the circuit substrate emerging from the solder wave, illustrating in greater detail the cooperation of the wire with the solder formations on the substrate.
Figure 6:
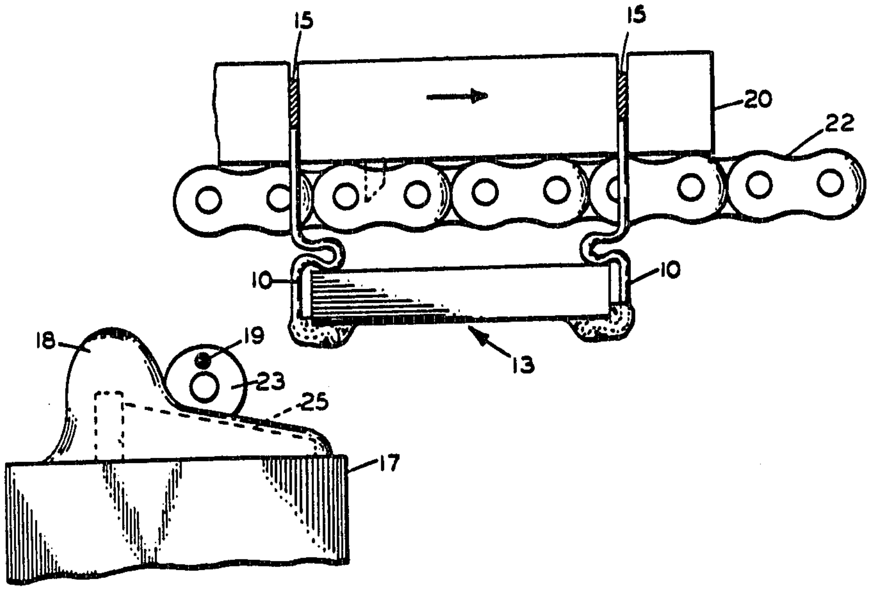
FIG. 6 is a view similar to FIG. 5 illustrating the circuit substrate after it has passed the solder wave and wire.

The circuit substrate 13 proceeds toward the solder wave, as illustrated in FIG. 2. As the circuit substrate 13 continues in its path, the crest 18 of the solder wave engages with the forward position of the circuit 11 and the forward clip leads 10—10, as shown in FIG. 3. As the substrate 13 continues, the wire 19 engages with the solder formation to limit its size, as viewed in FIGS. 4 and 5. As shown in FIG. 6, the solder formations formed on the substrate 13 are limited in size, so that iciclelike formations, which tend to be present in the absence of the fine wire 19, do not occur.

Note, as illustrated in the drawings, the wire 19 is oriented above the reflecting baffle 25 so that the iciclelike formations on the circuit board are in their liquid state as they contact the wire 19. The wire 19, also, is positioned so that clearance is provided between the wire 19 and the terminal ends of the leads 10—10. The wire 19 is supported at its ends by adjustable cams 23—23, which, by their adjustment, cause the wire 19 to be raised and lowered with precisional accuracy. The fine wire 19, thus, breaks the surface tension of the iciclelike formations of molten solder which would otherwise be produced and reduces the size of the solder profile of the circuit substrate 13. If the wire 19 were to physically touch the clip leads 10—10, in addition to possible snagging or removal thereof, "cold" solder connections between the clip leads 10—10 and the contact pads 14—14 may result. In the absence off the reflecting baffle 25, the iciclelike formations may cool to their plastic state, and the wire 19 may cool to room temperature, whereby contact by the cool wire 19 with the formations could tend to further cool the formations and cause a "cold" solder connection.

A "cold" solder connection can take place when the two parts to be soldered are moved with respect to each other as the molten solder joining them solidifies. To the eye, the connection may appear to be proper. Electrically, no connection or an intermittent connection may be present. Cold solder connections, therefore, are deceptive and unreliable and can be a source of serious trouble.

In a specific embodiment, it was found desirable to position the stretched wire about five-sixteenths of an inch from the undisturbed solder wave and 3 to 5 mils below the wire clips so that a total solder profile of 25 mils or less exists from the surface of the substrate. The optimum diameter of wire is believed to be 20 mils.

Wires of ⅛-inch diameter and larger have been found to be ineffective in reducing icicle height. More efficient results are obtained with finer wire. Stainless steel wire of 20 mils is both efficient and durable.

The term "fine wire" used throughout the claims is meant to include wire having a diameter less than one-eighth inch.

Although there is illustrated a specific form of substrate in FIG. 1, it is understood that this invention is applicable to various types of substrates including printed circuit boards, glass, and ceramic. The invention is further applicable to those types of substrates wherein the leads are affixed to a circuit at contact pads as specifically illustrated herein, and is also applicable to those circuit substrates wherein leads are coupled through holes of the substrates to contact the circuit affixed to the substrate.

What is claimed is:

1. Apparatus for soldering conductive leads to a circuit that is affixed to a surface of a substrate to provide electrical junctions, wherein the terminal portions of said leads extend beyond said surface by distances not exceeding a predetermined distance, comprising:
- a device for applying a wave of molten solder to said surface;
- means for moving the substrate past said wave-soldering device whereby iciclelike formations of solder tend to form at the junctions of said leads with said circuit; and
- a fine wire for reducing the size of the iciclelike formations, the wire oriented a fixed distance from the crest of the wave of molten solder to warm the wire above room temperature and another fixed distance in excess of said predetermined distance from said surface so that said wire engages with and breaks the surface tension of said solder formations without contacting said leads.

2. In apparatus, as recited in claim 1, the improvement wherein said wire is oriented parallel to the principal axis of said wave-soldering device and transverse to the direction of movement of said substrate.

3. Apparatus in accordance with claim 2, including said wave-soldering device and said moving means in combination with said wire, in cooperating relationship as set forth.

4. A wave-soldering apparatus wherein the size of iciclelike formations of solder on the lower surface of an electrical circuit board are reduced, comprising:
- a wave-soldering device for producing a wave of molten solder, the wave having a predetermined crest;
- a taut fine wire positioned below and spaced from but close to the crest of the wave of molten solder, said solder warming the wire above room temperature; and
- means for moving the circuit board past the soldering device to engage the lower surface of the board with said crest and for moving said surface past the wire, the wire being positioned so that there is a small space between the surface of the wire and the greatest projection on the lower surface of the circuit board when said board is passed by the wire, the formations of solder being in the molten state and engaging with the wire when the circuit board passes by the wire, whereby the formations of solder are limited in size.

5. The apparatus in accordance with claim 4, wherein said space measures 0.003 to 0.005 inch.

6. The apparatus in accordance with claim 4, wherein said fine wire has a diameter approximately 0.020 inch.

7. In combination,
- a wave-soldering device for producing a molten wave of solder along a horizontal path, the crest of said wave being produced at a distance $a$ with respect to a reference plane;
- a substrate having a circuit affixed to one surface thereof and a plurality of leads coupled to said circuit, the terminal portions of said leads extending beyond said surface by distances not exceeding a fixed distance $b$ from said surface;
- a horizontal fine wire, parallel to said path, located at one side of, and proximate to, the crest of the wave of molten solder to warm the wire above room temperature, said wire being oriented at a distance $c$ with respect to said reference plane; and
- means for transporting said substrate from the other side of the wave-soldering device, past the molten wave, and hence over the horizontal wire, said substrate being transported with said one surface oriented downward at a distance $d$ with respect to the reference plane, whereby iciclelike formations of solder formed at the junctions of said leads with said circuit are reduced in size due to the breaking of its surface tension by said wire; wherein $a>d$ and $(b+c)<d$.

8. The combination according to claim 7, wherein $d$-$b$-$c$ is from 3 to 5 mils.

9. An apparatus for wave soldering the lower surface of an electrical circuit board and for reducing the size of iciclelike formations of solder on such lower surface, comprising:

a wave-soldering device for producing a wave of molten solder, the wave having a predetermined crest;

a taut fine wire positioned below and spaced from the crest of the wave of molten solder, whereby heat from the solder aids in warming the wire;

means for first moving the lower surface of the circuit board past the soldering device to engage such surface with said crest to thereby apply molten solder to said surface and produce iciclelike formations depending from said surface, and then for moving said surface past the wire; and a baffle spaced beneath the wire and over which the molten solder flows for reflecting heat from the molten solder to aid in warming the wire above room temperature and to maintain the solder applied to the board in its molten form, the warm wire being positioned so that there is a small space between the surface of the wire and the lower surface of the circuit board when said board is passed by the wire, the molten iciclelike formations of solder engaging the warm wire when said surface passes by the wire, whereby said formations are limited in size.

10. A wave-soldering apparatus comprising:

a wave-soldering device for producing a wave of molten solder;

a taut fine wire oriented a fixed distance from the crest of the wave of molten solder to warm the wire above room temperature; and means for first moving the circuit board past the soldering device to apply the wave of solder to the lower surface of the board and to produce iciclelike formations of solder depending from the surface, and for then moving said board past and a predetermined distance from the wire, the wire being positioned so that it engages any iciclelike formations of solder depending from the surface to thereby limit their formations.